(12) United States Patent
Weng et al.

(10) Patent No.: US 9,685,962 B2
(45) Date of Patent: Jun. 20, 2017

(54) CLOCK DATA RECOVERY APPARATUS AND METHOD AND PHASE DETECTOR

(71) Applicant: MStar Semiconductor, Inc., Hsinchu Hsien (TW)

(72) Inventors: Meng-Tse Weng, Hsinchu County (TW); Chun-Wen Yeh, Hsinchu County (TW); Jiunn-Yih Lee, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/207,855

(22) Filed: Jul. 12, 2016

(65) Prior Publication Data

US 2017/0070230 A1    Mar. 9, 2017

(30) Foreign Application Priority Data

Sep. 4, 2015    (TW) .............................. 104129326 A

(51) Int. Cl.

| H04L 7/00 | (2006.01) |
|---|---|
| H03L 7/08 | (2006.01) |
| H03L 7/091 | (2006.01) |
| H03L 7/18 | (2006.01) |
| H04L 7/033 | (2006.01) |
| H04L 7/027 | (2006.01) |

(52) U.S. Cl.
CPC ............ *H03L 7/0807* (2013.01); *H03L 7/091* (2013.01); *H03L 7/18* (2013.01); *H04L 7/0276* (2013.01); *H04L 7/0332* (2013.01)

(58) Field of Classification Search
CPC ..... H04L 7/0337; H04L 7/0334; H04L 7/033; H03L 7/087
USPC .................. 375/355, 375, 376; 455/103, 127
See application file for complete search history.

(56) References Cited

U.S. PATENT DOCUMENTS

| 2005/0213696 A1* | 9/2005 | Totsuka .................... H03L 7/07 375/376 |
| 2015/0200766 A1* | 7/2015 | Zhang ................... H04L 7/0033 375/355 |
| 2016/0087636 A1* | 3/2016 | Lai ......................... H03K 23/68 327/115 |

\* cited by examiner

*Primary Examiner* — Khai Tran
(74) *Attorney, Agent, or Firm* — WPAT, PC; Justin King; Douglas A. Hosack

(57) ABSTRACT

A clock data recovery apparatus includes an oscillator, a phase detector and an oscillator control circuit. The oscillator generates an original clock signal. The phase detector includes a first sampling circuit, a frequency dividing circuit, a second sampling circuit and a selecting circuit. The first sampling circuit samples a data signal using the original clock signal to generate a first set of sample results. The frequency dividing circuit divides the original clock signal to generate a frequency divided clock signal. The second sampling circuit performs sampling using the frequency divided clock signal to generate a second set of sample results. The selecting circuit selectively outputs one of the first and second sets of sample results as a final set of sample results. The oscillator control circuit controls the oscillator according to the final set of sample results.

20 Claims, 13 Drawing Sheets

CLOCK DATA RECOVERY APPARATUS AND METHOD AND PHASE DETECTOR

This application claims the benefit of Taiwan application Serial No. 104129326, filed Sep. 4, 2015, the subject matter of which is incorporated herein by reference.

BACKGROUND OF THE INVENTION

Field of the Invention

The invention relates in general to a phase detector, and more particularly to a phase detector capable of processing data signals having multiple transmission rates.

Description of the Related Art

A clock data recovery apparatus is a circuit extensively applied in an electronic signal receiving system. FIG. 1(A) shows a functional block diagram of a typical clock data recovery apparatus. A phase detector 11 samples an input data signal $D_{IN}$ using a clock signal CLK, and generates a control signal according to the sample result to indicate whether the frequency of the clock signal CLK should be increased or reduced. The control signal adjusts a control voltage that a charge pump 12 and the a low-pass filter (LPF) 13 output. The control voltage is provided to a voltage-controlled oscillator (VCO) 14 to change the frequency of the clock signal CLK. In certain data recovery apparatuses, as shown in FIG. 1(A), a part of the sample result generated from the input signal $D_{IN}$ by the phase detector 11 can directly become a recovered signal $D_{OUT}$.

FIG. 1(B) shows a partial functional block diagram of the phase detector by taking an Alexander phase detector as an example. To adapt to such phase detector architecture, the clock signal CLK outputted by the VCO 14 includes four clock signals having the same frequency but different phases. As the frequency of the clock signal CLK is about a half of the transmission rate of the input data signal $D_{IN}$, this phase detector is referred to as half-rate architecture. As shown in FIG. 1(B), flip-flops 111A to 111D in the phase detector 11 sample the data signal $D_{IN}$ using rising edges of clock signals CLK0, CLK180, CLK90 and CLK270 respectively having phases of 0°, 90°, 180° and 270° to generate four sample results D0, D1, Q0 and Q4. The sample results D0 and D1 correspond to two adjacent sets of data, and the sample results Q0 and Q1 correspond to an intersection of the two adjacent sets of data. Generally known to one person having ordinary skill in the art, performing an appropriate exclusive-OR (XOR) logic operation on the sample results D0, D1, Q0 and Q1 may generate a control signal that causes charging or discharging the charge pump 12 to further selectively adjust the frequency of the clock signal CLK.

In many communication standards, the input data signal $D_{IN}$ is designed to have different transmission rates under different communication modes. For example, in High Definition Multimedia Interface (HDMI), the transmission rate of data signals is between 250 Hz and 3.4 KHz. In practice, rendering the frequency range of clock signals generated by the VCO to be as wide as the range of the transmission rate of data signals is extremely challenging. Thus, as shown in FIG. 1(C), for a communication standard having multiple transmission rates, a frequency divider 16 and a multiplexer 17 may be additionally provided between the VCO 14 and the phase detector 11 of the clock data recovery apparatus. By dividing the frequency of an original clock signal $CLK_{ORG}$ outputted from the VCO 14 using the frequency divider 16, clock signals having different frequencies can be obtained. In this example, the frequency divider 16 provides the clock signal CLK0 having the same frequency as the original clock signal $CLK_{ORG}$, a clock signal CLK_DIV2 having a frequency divided to one-half, and a clock signal CLK_DIV4 having a frequency divided to one-fourth. If the original clock signal $CLK_{ORG}$ outputted from VCO 14 includes clock signals having the same frequency but different phases, the frequency divider 16 may divide these four clock signals to provide the phase detector 11 with frequency divided clock signals having four different phases.

The phase detector 11 is usually designed to adopt one single type of circuit architecture, e.g., full-rate architecture, or half-rate architecture shown in FIG. 1(B). When the transmission rate of the input data signal $D_{IN}$ is changed, the multiplexer 17 is required to switch to a set of clock signals having a more appropriate frequency for the phase detector 11. For example, when the transmission rate of the input data signal $D_{IN}$ is reduced to one-half, the multiplexer 17 may switch from outputting the clock signals of the clock signal CLK0 having four phase to outputting the clock signals of the clock signal CLK_DIV2 having four phases, so as to keep the relationship between the transmission rate of the data signals and the frequency of the clock signals unchanged. Compared to the method rendering the clock frequency generated by the VCO 14 to cover the range of the transmission rate of data signals, the specification requirements of the clock data recovery apparatus associated with the VCO 14 in FIG. 1(C) can be less demanding and hardware costs can thus be reduced.

The amount of jittering is an important index when the performance of a clock data recovery apparatus is evaluated, and is closely correlated with the quality of signals received. In general, as the path passed gets longer and the number of circuit elements contributing the jittering gets larger, the amount of jittering in the signals becomes larger. Thus, the frequency divider 16 and the multiplexer 17 additionally provided in FIG. 1(C) cause an increase in the amount of jittering in the clock signal CLK. Even the amount of jittering of the clock signal CLK0, which has the same frequency as the original clock signal $CLK_{ORG}$ and need not be processed by the frequency divider 16, is inevitably affected by negative influences of the multiplexer 17. To counteract the increased amount of jittering caused by the frequency divider 16 and the multiplexer 17, the VCO 14 is usually required to generate original clock signals $CLK_{ORG}$ having a better quality, meaning that hardware costs of the VCO 14 are again increased. In contrast, if the VCO 14 having a better signal quality but higher costs is not adopted in FIG. 1(A), the frequency divider 16 and the multiplexer 17 may cause degraded performance of the clock data recovery apparatus.

SUMMARY OF THE INVENTION

To solve the above issues, the invention is directed to a clock data recovery apparatus and a phase detector.

According to an embodiment of the present invention, a clock data recovery apparatus is provided. The clock data recovery apparatus includes an oscillator, a phase detector and an oscillator control circuit. The oscillator generates an original clock signal. The phase detector includes a first sampling circuit, a frequency dividing circuit, a second sampling circuit and a selecting circuit. The first sampling circuit samples a data signal using the original clock signal to generate a first set of sample results. The frequency dividing circuit divides the original clock signal to generate a frequency divided clock signal. The second sampling circuit performs sampling using the frequency divided clock signal to generate a second set of sample results. The selecting circuit selectively outputs one of the first set of sample results and the second set of sample results as a final set of sample results. The oscillator control circuit controls the oscillator according to the final set of sample results.

A phase detector is provided according to another embodiment of the present invention. The phase detector includes a frequency dividing circuit and N sampling circuits, where N is a positive integer greater than 1. The frequency dividing circuit divides the frequency of an original clock signal to generate (N−1) frequency divided clock signals having different frequencies. The N sampling circuits generate N sets of sample results. A first sampling circuit in the N sampling circuits is coupled to the oscillator, receives the original clock signal that the oscillator generates, and samples a data signal using the original clock signal to generate a first set of sample results in the N sets of sample results. An $i^{th}$ sampling circuit in the N sampling circuits receives an $(i-1)^{th}$ frequency divided clock signal from the frequency dividing circuit, and samples the data signal or the $(i-1)^{th}$ set of sample results using the $(i-1)^{th}$ frequency divided clock signal to generate an $i^{th}$ set of sample results, where i is an integer index ranging between 2 and N.

A clock data recovery method is provided according to another embodiment of the present invention. A data signal and an original clock signal are received. The data signal is sampled using the original clock signal to generate a first set of sample results. The frequency of the original clock signal is divided to generate a frequency divided clock signal. A second set of clock signals are generated by performing sampling with the frequency divided clock signal. The original clock signal is adjusted selectively according to one of the first set of sample results and the second set of sample results.

The above and other aspects of the invention will become better understood with regard to the following detailed description of the preferred but non-limiting embodiments. The following description is made with reference to the accompanying drawings.

Figure 1A:
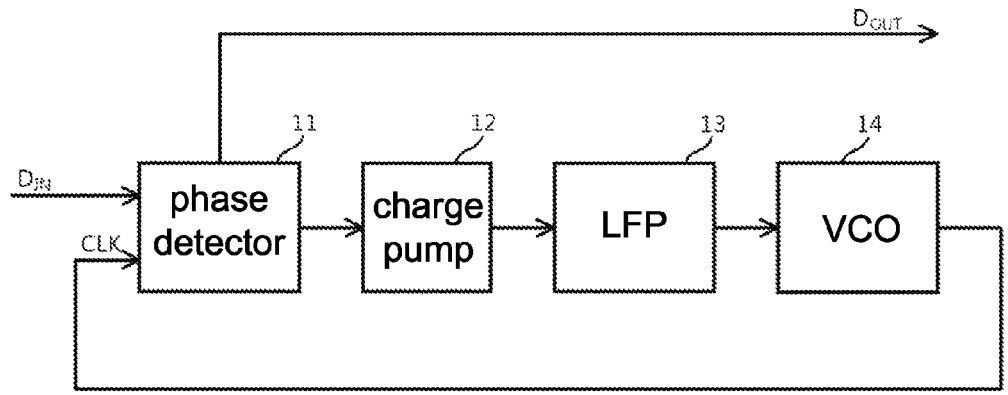
FIG. 1(A) is a functional block diagram of a typical clock data recovery apparatus.
Figure 1B:
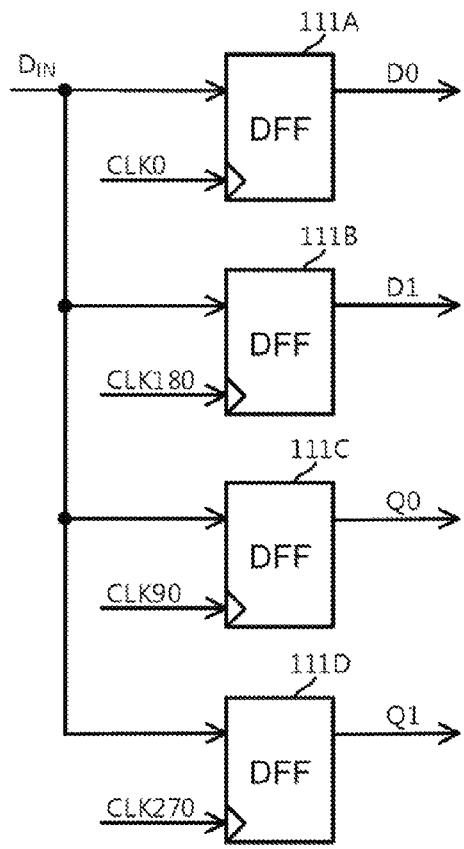
FIG. 1(B) is a partial functional block diagram of a typical half-rate phase detector.
Figure 1C:
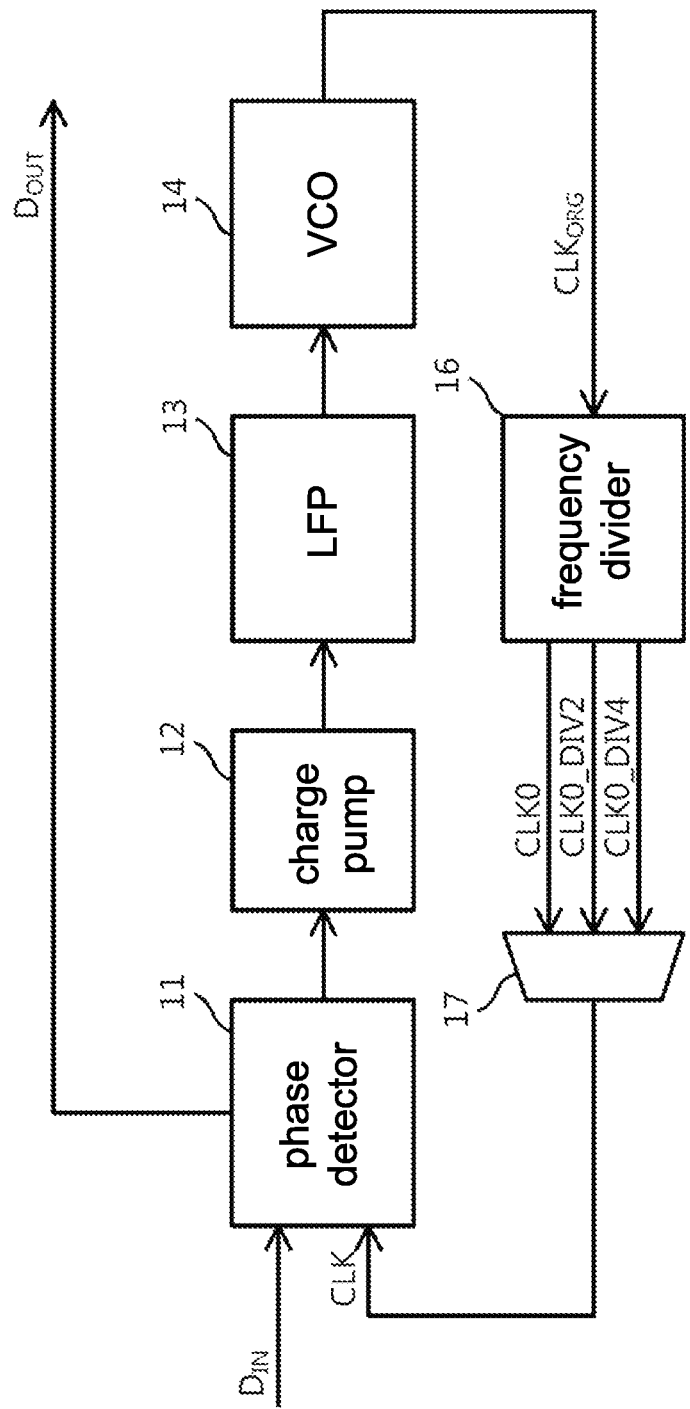
FIG. 1(C) is a functional block diagram of another typical clock data recovery apparatus.

It should be noted that, the drawings of the present invention include functional block diagrams of multiple functional modules related to one another. These drawings are not detailed circuit diagrams, and connection lines therein are for indicating signal flows only. The interactions between the functional elements/or processes are not necessarily achieved through direct electrical connections. Further, functions of the individual elements are not necessarily distributed as depicted in the drawings, and separate blocks are not necessarily implemented by separate electronic elements.

DETAILED DESCRIPTION OF THE INVENTION

Figure 2:
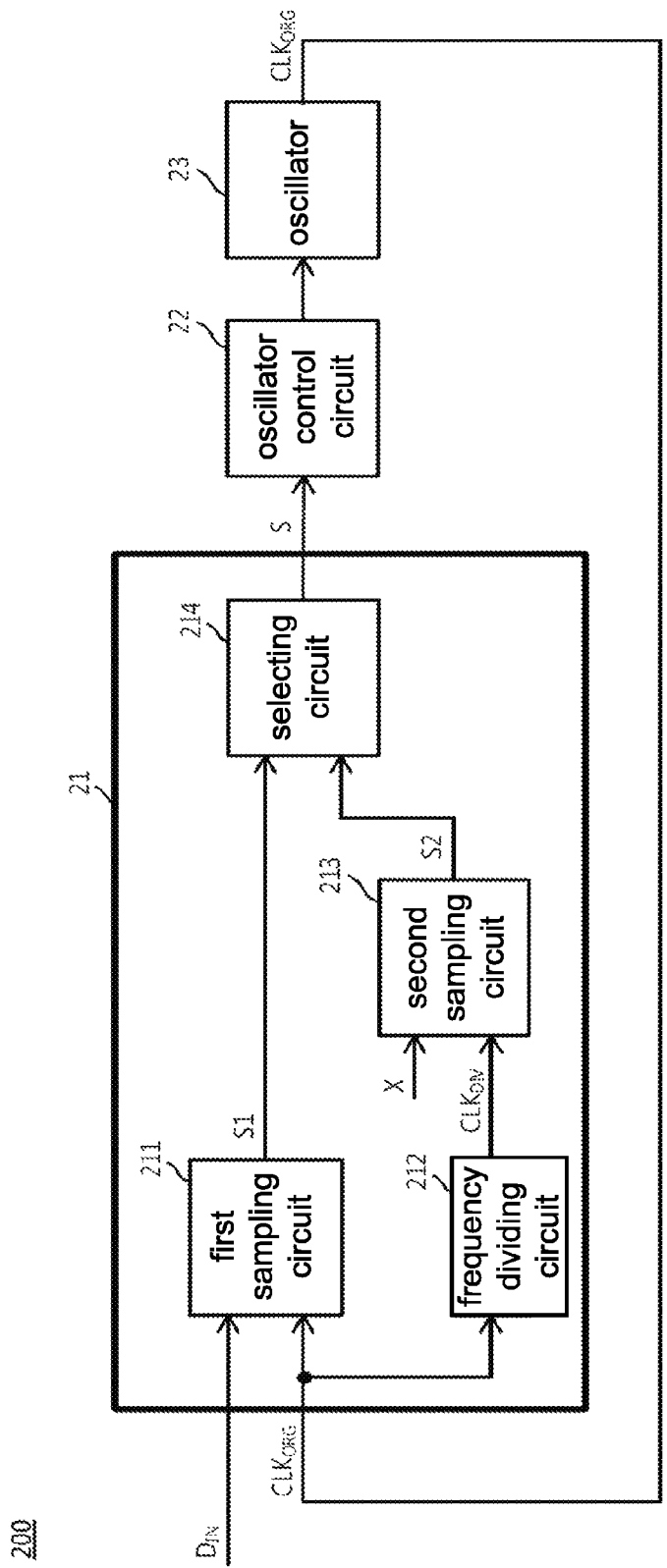
FIG. 2 is a functional block diagram of a clock data recovery apparatus according to an embodiment of the present invention.

FIG. 2 shows a functional block diagram of a clock data recovery apparatus according to an embodiment of the present invention. Referring to FIG. 2, a clock data recovery apparatus 200 includes a phase detector 21, an oscillator control circuit 22 and an oscillator 23. The phase detector 21 includes a first sampling circuit 211, a frequency dividing circuit 212, a second sampling circuit 213 and a selecting circuit 214.

As shown in FIG. 2, the first sampling circuit 211 is directly coupled to the oscillator 23, and receives an original clock signal $CLK_{ORG}$ that the oscillator 23 generates. Using the original clock signal $CLK_{ORG}$, the first sampling circuit 211 samples a data signal $D_{IN}$ to generate a first set of sample results S1. The frequency dividing circuit 212 also receives the original clock signal $CLK_{ORG}$ from the oscillator 23, and divides the frequency of the original clock signal $CLK_{ORG}$ to generate a frequency divided clock signal $CLK_{DIV}$. Different from the first sampling circuit 211, the second sampling circuit 213 samples a signal X using the frequency divided signal $CLK_{DIV}$ to generate a second set of sample results S2. It should be noted that, the frequency dividing ratio provided by the frequency dividing circuit 212 is not limited to a specific value, and may be determined by a circuit designer according to actual needs (e.g., the variation range of the transmission rate of the data signal $D_{IN}$). Further, details of the signal X are to be given shortly in various embodiments below.

The selecting circuit 214 selectively outputs the first set of sample results S1 or the second set of sample results S2 as a final set of sample results S. The oscillator control circuit 22, coupled between the phase detector 21 and the oscillator 23, controls the oscillator 23 according to the final set of sample results S. For example but not limited to, the oscillator control circuit 23 may include elements such a logic circuit that performs an exclusive-OR (XOR) operation on the final set of sample results S, a charge pump and a low-pass filter (LPF).

The phase detector 21 according to an embodiment of the present invention is regarded as having more than one sampling modes, which may be switched by selecting different sample results. In one embodiment, the selecting circuit 214 determines to output the first set of sample results S1 or the second set of sample results S2 according to the transmission rate of the data signal $D_{IN}$. Associated details are given below with the examples in FIG. 3(A) to FIG. 3(C).

Figure 3A:
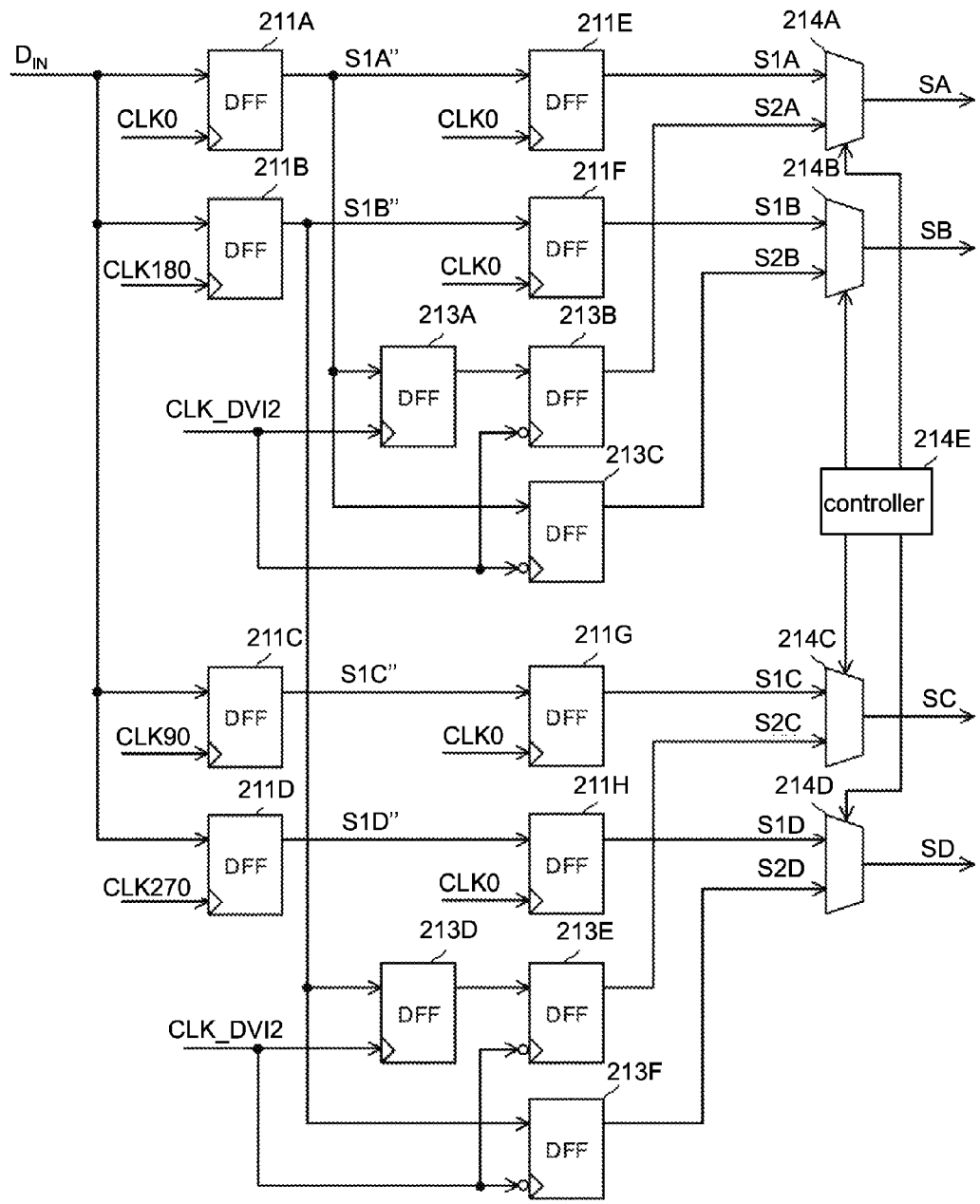
FIG. 3(A) is a detailed example of a phase detector according to an embodiment of the present invention.

FIG. 3(A) shows a detailed example of the phase detector 21. In this example, the first sampling circuit 211 includes eight D flip-flops (DFF) 211A to 211H, the second sampling circuit 213 includes six DFFs 213A to 213F, and the selecting circuit 214 includes four multiplexers 214A to 214D. The multiplexers 214A to 214D are controlled by a controller 214E, and provide output signals as the final set of sample results S in FIG. 2. Assume that the original clock signal $CLK_{ORG}$ outputted by the oscillator 23 includes clock signals CLK0, CLK90, CLK180 and CLK270 having the same frequency but different phases. As shown in FIG. 3(A), the DFFs 211A to 211D in the first sampling circuit 211 sample the data signal $D_{IN}$ using respective rising edges (four state transition points of the original clock signal $CLK_{ORG}$) of the clock signals CK0, CLK90, CLK180 and CLK270 to generate four sample results S1A" to S1D". The phase differences between any one of these four state transition points and the remaining three state transition points are respectively 90°, 180° and 270°. The DFFs 211E to 211H are coupled to output ends of the DFFs 211A to 211D, respectively, and sample the output signals S1A" to S1D" of the DFFs 211A to 211D using the clock signal CLK0 to generate four synchronized sample results S1A to S1D as the first set of sample results S1.

The frequency dividing ratio of the frequency dividing circuit 212 (not depicted to keep the diagram simple) in this example is 2, and so the frequency divided clock signal $CLK_{DIV}$ in FIG. 2 is represented as CLK_DIV2 in FIG. 3(A). It should be noted that, detail operations of the frequency dividing circuit 212 are generally known to one person having ordinary skill in the art, and shall be omitted herein and do not form limitations to the scope of the present invention.

As shown in FIG. 3(A), the DFFs 213A to 213F in the second sampling circuit 213 perform sampling using a rising edge or a falling edge of the frequency divided clock signal CLK_DIV2. Further, the signal X forwarded into the second sampling circuit 213 includes the output signals S1A" and S1B" of the DFFs 211A and 211B. More specifically, the sample targets of the DFFs 213A and 213C are the output signal S1A" of the DFF 211A, the sample target of the DFFs 213D and 213F are the output signal S1B" of the DFF 211B, the sample target of the DFF 213B is the output signal of the DFF 213A, and the sample target of the DFF 213E is the output signal of the DFF 213D. The output signal of the second sampling circuit 213 is the sample results S2A to S2D (i.e., the foregoing second set of sample results S2) of the DFFs 213B, 213C, 213E and 213F.

Figure 3B:
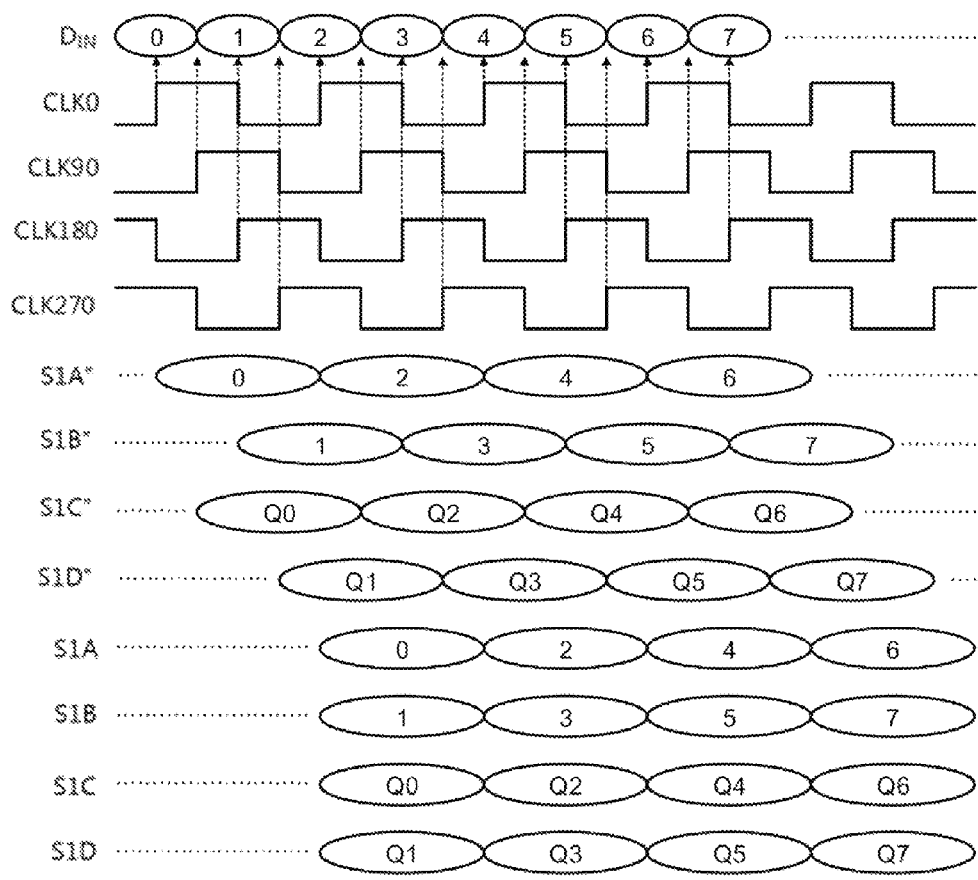
FIG. 3(B) and FIG. 3(C) are timing diagrams of the phase detector corresponding to a half-rate mode and a full-rate mode, respectively.
Figure 3C:
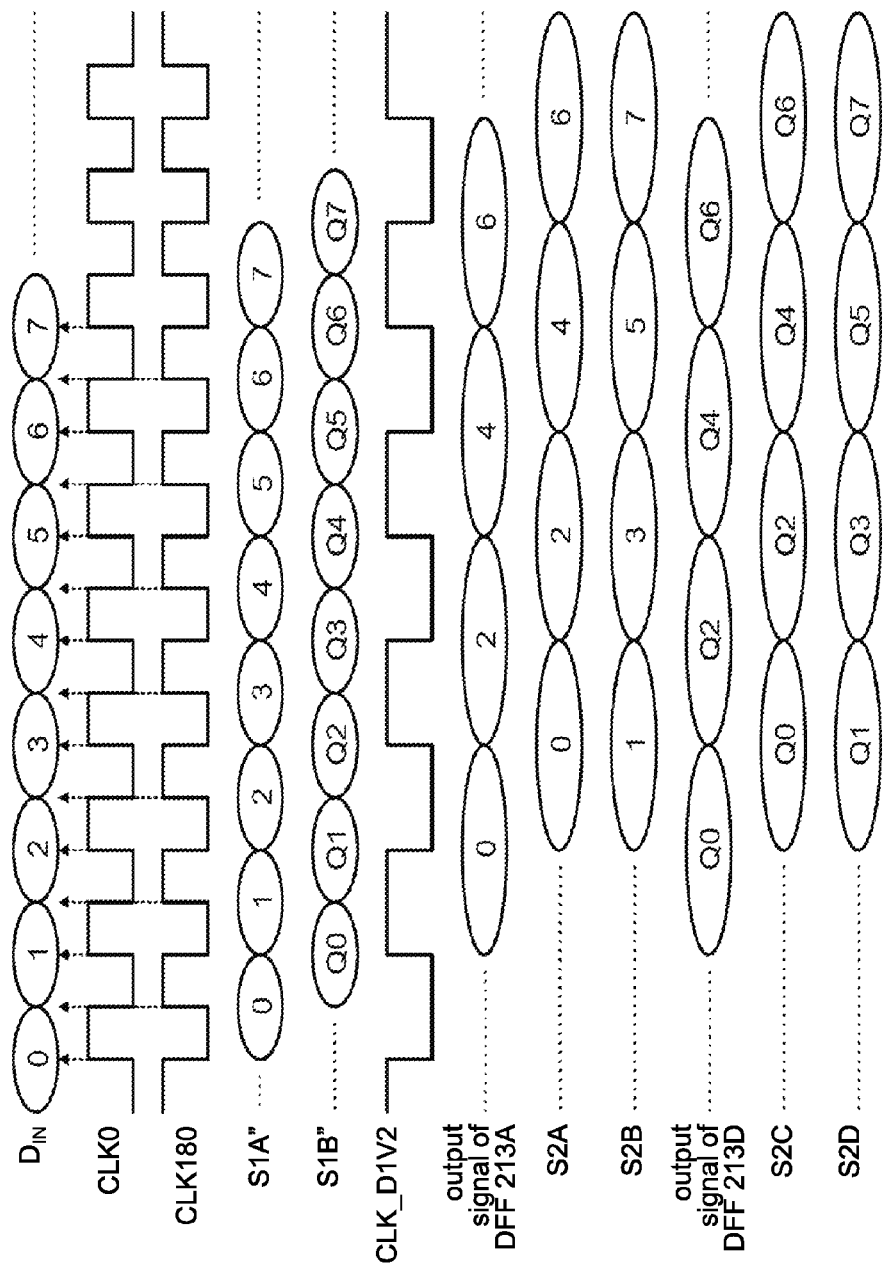

The phase detector 21 in FIG. 3(A) has two sampling modes—a half-rate mode and a full-rate mode. When the transmission rate of the data signal $D_{IN}$ is twice the frequency of the original clock signal $CLK_{ORG}$, the phase detector 21 may be set to the half-rate mode (the frequency of the original clock signal $CLK_{ORG}$ is a half of the transmission rate of the data signal $D_{IN}$). When the transmission rate of the data signal $D_{IN}$ is the same as the frequency of the original clock signal $CLK_{ORG}$, the phase detector 21 may be set to the full-rate mode. When the phase detector 21 is in the half-rate mode, the multiplexers 214A to 214D are set by the controller 214E to output the sample results S1A to S1D. When the phase detector 21 is in the full-rate mode, the multiplexers 214A to 214D are set by the controller 214E to output the sample results S2A to S2D. In one embodiment, the controller 214E may receive an external signal to generate the control signal for the multiplexers 214A to 214D. Alternatively, the controller 214E may generate the control signal for the DFFs 211A to 211H and 213A to 213F according to the external signal to disable or enable one or multiple of these DFFs. Further, the controller 214E may control the frequency dividing circuit 212 in FIG. 2 according to the external signal to output the frequency divided clock signal $CLK_{DIV}$ that the second sampling circuit 213 requires. FIG. 3(B) and FIG. 3(C) show timing diagrams respectively corresponding to the half-rate mode and the full-rate mode, which are described below.

Referring to FIG. 3(B), the DFF 211A performs sampling using the rising edge of the clock signal CLK0. According to the relationship of the signals in FIG. 3(B), the DFF 211A sequentially provides data denoted as 0, 2, 4 and 6 from sampling the data signal $D_{IN}$. The DFF 211B performs sampling using the rising edge of the clock signal CLK180, and sequentially provides data denoted as 1, 3, 5 and 7 from sampling the data signal $D_{IN}$. On the other hand, the DFF 211C performs sampling using the rising edge of the clock signal CLK90, and provides a sample result S1C" that sequentially includes results Q0, Q2, Q4, Q6 respectively sampled at a transition edge between the data 0 and the data 1, a transition edge between the data 2 and the data 3, a transition edge between the data 4 and the data 5, and a transition edge between the data 6 and the data 7. Similarly, the DFF 211D performs sampling using the rising edge of the clock signal CLK270, and provides the sample result S1D" that sequentially includes results Q1, Q3, Q5 and Q7 sampled at the transition edges. As generally known to one person having ordinary skill in the art, using the concept of Alexander phase detection, by performing an appropriate XOR logic operation on the sample results S1A to S1D in FIG. 3(B), it can be determined whether the frequency of the original clock signal $CLK_{ORG}$ should be increased or reduced. Taking the oscillator control circuit 22 including a charge pump for instance, in the half-rate mode, the sample results S1A to S1D that the multiplexers 214A to 214D select as the output signals SA to SD can a reference for generating the control signal for charging or discharging the charge pump. Associated details are generally known to one person having ordinary skill in the art, and shall be omitted herein. On the other hand, the sample results S1A and S1B corresponding to the data contents may also serve as recovered data signals and be outputted from the clock data recovery apparatus 200.

Refer to FIG. 3(C). As previous described, when the phase detector 21 is in the full-rate mode, the multiplexers 214A to 214D are set by the controller 214 to output the sample results S2A to S2D. As observed from FIG. 3(A), the DFF 213B samples the output signal of the DFF 213A using the falling edge of the frequency divided clock signal CLK_DIV2, and the DFF 213A samples the output signal of the DFF 211A using the rising edge of the frequency divided clock signal CLK_DIV2. According to the relationship of the signals in FIG. 3(C), the DFF 213B sequentially provides the data denoted 0, 2, 4 and 6 from sampling the data signal $D_{IN}$. The DFF 213C samples the output signal of the DFF 211A using the falling edge of the frequency divided clock signal CLK_DIV2 to sequentially provide the data denoted 1, 3, 5 and 7 from sampling the data signal $D_{IN}$. On the other hand, the DFF 213E samples the output signal of the DFF 213D using the falling edge of the frequency divided signal CLK_DIV2 to sequentially provide the results Q0, Q2, Q4 and Q6 sampled at the transition edges. Similarly, the DFF 213F samples the output signal of the DFF 213B using the falling edge of the frequency divided clock signal CLK_DIV2 to provide a sample result that sequentially includes the results Q1, Q3, Q5 and Q7 sampled at the transition edges. As generally known to one person having ordinary skill in the art, in the full-rate mode, the sample results S2A to S2D that the DFFs 214A to 214D select as the output signals SA to SD can a reference for generating the control signal for charging or discharging the charge pump. Similarly, the sample results S2A and S2B corresponding to the data contents may serve as recovered data signals and be outputted from the clock data recovery apparatus.

It is seen from the above description that, when the phase detector 21 is in the half-rate mode, the frequency dividing circuit 212 and the second sampling circuit 213 (the DFFs 213A to 213F) have no effect on the output signals SA to SD of the multiplexers 214A to 214D, and may thus be disabled to reduce power consumption. Similarly, when the phase detector 21 is in the full-rate mode, the DFFs 211C and 211D in the first sampling circuit 211 have no effect on the output signals of the multiplexers 214A to 214D, and can also be disabled. In one embodiment, the control signal for disabling the frequency dividing circuit 212 and the DFFs 213A to 213F in the half-rate mode and the control signal for disabling the DFFs 211C and 211D in the full-rate mode may be generated by the controller 214E.

As seen from FIG. 2 and FIG. 3(A), as the first sampling circuit 211 is directly coupled to the oscillator 23 without any other circuit elements disposed in between (e.g., the frequency dividing circuit and/or multiplexer(s)), the clock signal in the first sampling circuit 211 for sampling is the original clock signal $CLK_{ORG}$ outputted from the oscillator 23. Compared to a clock signal that further passes through other circuit elements (e.g., the frequency divided clock signal $CLK_{DIV}$ in FIG. 2), the original clock signal $CLK_{ORG}$ has a smaller amount of jittering. Known to one person having ordinary skill in the art, to sample a data signal having a higher transmission rate, the requirements on the amount of jittering of the clock signal are more strict. In the clock data recovery apparatus 200, to adapt to the data signal $D_{IN}$ having a higher transmission rate, the original clock signal $CLK_{ORG}$ having the smallest amount of jittering is adopted for sampling, and the selecting circuit 214 is made to select the first set of sample results S1 obtained using the original clock signal $CLK_{ORG}$. Since no compensation is needed for the jittering caused by the frequency dividing circuit and/or multiplexer(s), the clock data recovery apparatus 200 is capable of obtaining ideal sample results without adopting an oscillator having higher costs. In contrast, to adapt to the data signal $D_{IN}$ having a lower transmission rate, the selecting circuit 214 is made to select the second set of sample results S2. Because the requirements on the amount of jittering of the clock signal are less demanding, the quality of the sample results is not noticeably affected even when the performance of the amount of jittering of the frequency divided clock signal CLKDIV is slightly less satisfactory than the original clock signal $CLK_{ORG}$.

It should be noted that, the implementation forms of the first sampling circuit 211 and the second sampling circuit 213 are not limited to the examples in FIG. 3(A). That is, the first sampling circuit 211 and the second sampling circuit 213 are not limited to sampling with DFFs, or to the numbers of DFFs, the frequency dividing ratio or the relationship between the rising/falling edges of the signals depicted in FIG. 3(A). One person having ordinary skill in the art can understand that, the concept of the present invention can be realized by many other circuit configurations and elements without departing from the spirit of the present invention.

Figure 3D:
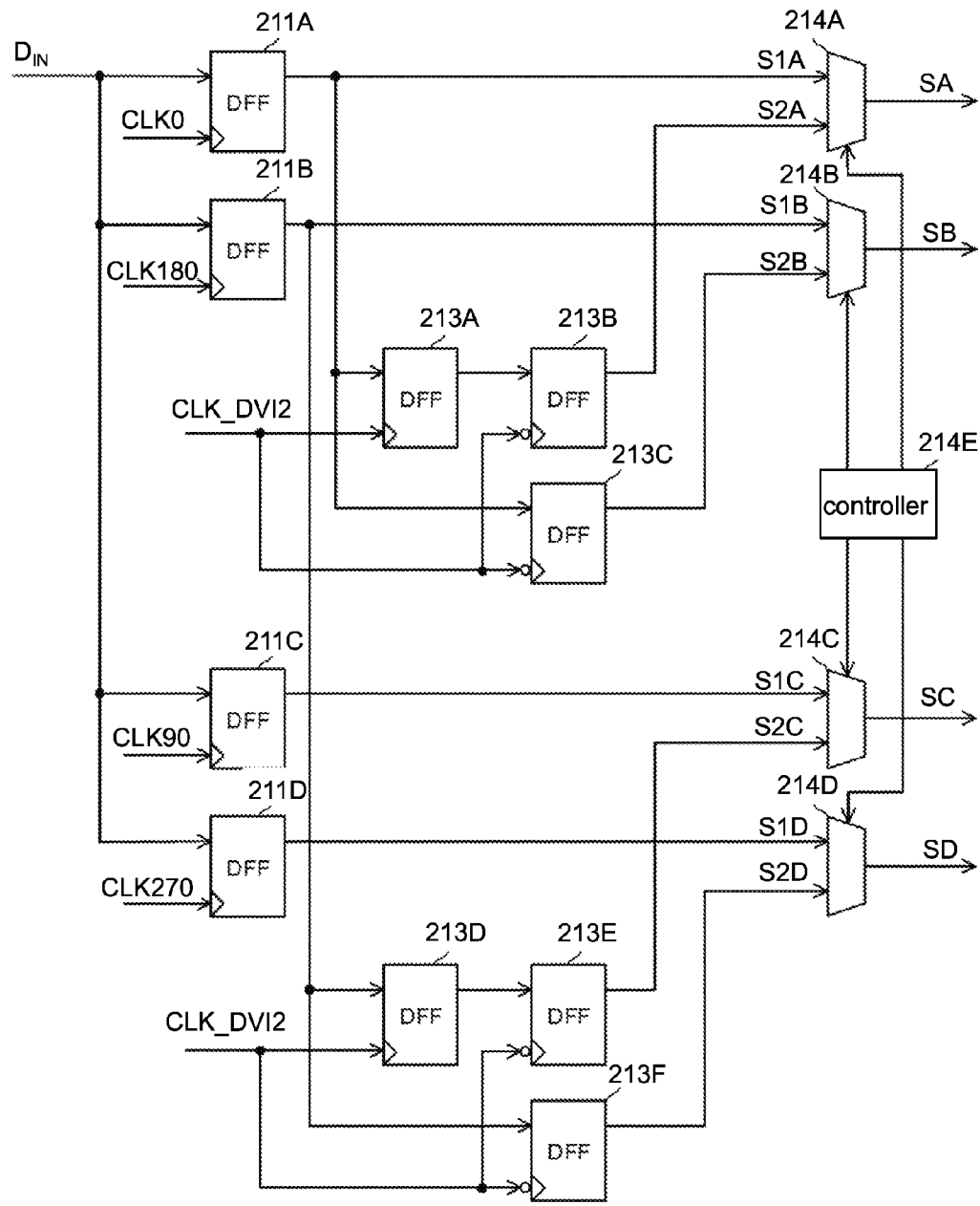
FIG. 3(D) is a detailed example of a phase detector according to another embodiment of the present invention.
Figure 3E:
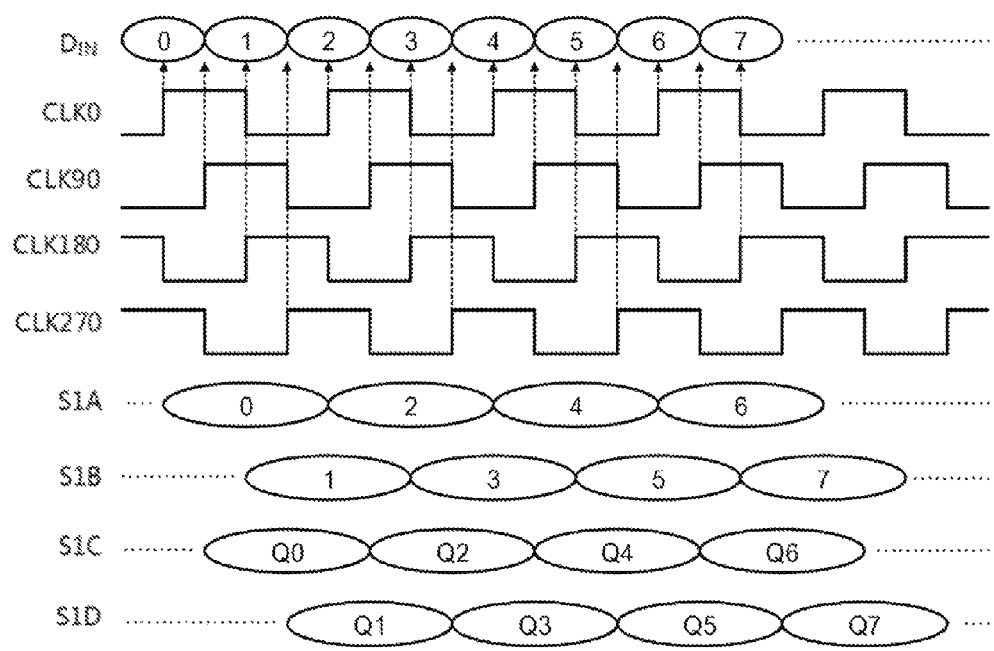
FIG. 3(E) is a timing diagram of the phase detector corresponding to a half-rate mode.

FIG. 3(D) shows a phase detector according to another embodiment of the present invention. A main difference between FIG. 3(A) and FIG. 3(D) is that, the first sampling circuit 211 in FIG. 3(D) does not include the DFFs 211E to 211H for performing synchronous sampling, and the output signals of the DFFs 211A to 211D are the sample results S1A to S1D. It is known from FIG. 3(B) and FIG. 3(E) that, the output signals S1A to S1D that the two types of phase detectors 21 in FIG. 3(A) and FIG. 3(D) in the half-rate mode are different. FIG. 3(E) shows a timing diagram of signals of the phase detector 21 in the half-rate mode in FIG. 3(D). As the sample time points of the DFFs 211A to 211D on the data signal $D_{IN}$ are different, it is seen from FIG. 3(E) that the time points at which the sample results corresponding to the data 0 and 1 and the results Q0 and Q1 sampled at the transition edges appear in the signals S1A to S1D are also different. It should be noted that, the oscillator control circuit 22 can still generate control signals for increasing or reducing the frequency of the original clock signal $CLK_{ORG}$ according to the four asynchronous sample results S1A to S1D through an appropriate XOR logic operation, with however the control signals possibly being asynchronous signals. Taking the oscillator control circuit 22 including a charge pump for example, among the control signals, the control signal for charging and the control signal for discharging the charge pump may be asynchronous signals. It should be noted that, even if the sample results S1A to S1D are asynchronous, the phase detector 21 in FIG. 3(D) nevertheless features the advantage of having a smaller amount of jittering.

On the other hand, in FIG. 3(D), the sample target of the second sampling circuit 23 (the signal X in FIG. 2) is S1A and S1B in the first set of sample results S1. When the phase detector 21 in FIG. 3(D) is in the full-rate mode, operations and the timing diagram of signals of the phase detector 21 are as shown in FIG. 3(C), and such details shall be omitted herein.

One person having ordinary skill in the art can understand that, given that the rising/falling edge of the sampling clock is appropriate selected and a delay element is appropriately added, the sample target of the second sampling circuit 23 (the signal X) in FIG. 2 may be the data signal $D_{IN}$ or another sample result generated according to the data signal $D_{IN}$, and sample results having the same contents may be obtained (although the timing may be slightly different from the sample results of the foregoing embodiment).

Figure 4A:
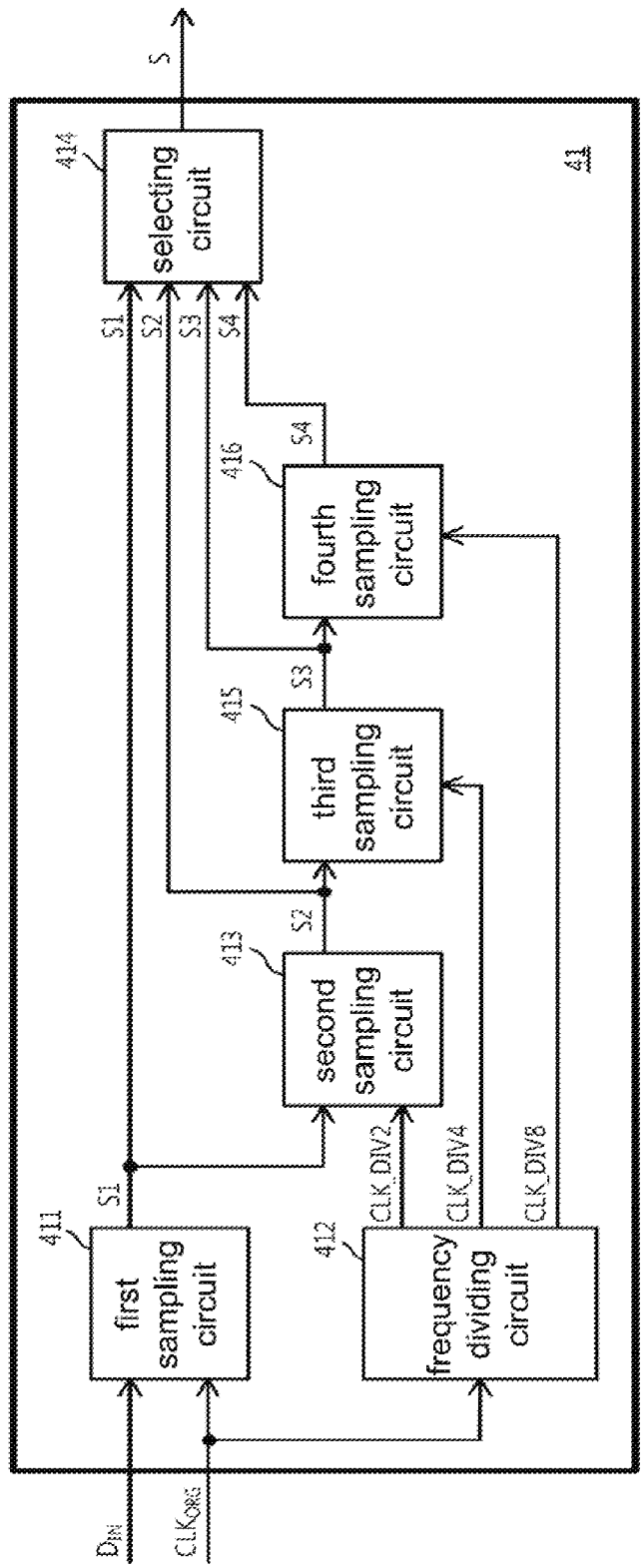
FIG. 4(A) is a functional block diagram of a phase detector having four sampling modes according to an embodiment of the present invention.

A phase detector of the present invention may include more than two sampling modes. A phase detector is provided according to another embodiment of the present invention. The phase detector, applied in collaboration with an oscillator to generate an original signal, includes a frequency dividing circuit and N sampling circuits, where N is a positive integer greater than 1. The frequency dividing circuit divides the frequency of an original clock signal that the oscillator generates to generate (N−1) frequency divided clock signals having different frequencies. FIG. 4(A) shows a functional block diagram of a phase detector that presents the concept of the present invention by taking N equal to 4, for example. A phase detector 41 includes a first sampling circuit 411, a frequency dividing circuit 412, a second sampling circuit 413, a selecting circuit 414, a third sampling circuit 415 and a fourth sampling circuit 416. As seen from FIG. 4(A), the four sampling circuits generate a total of four sets of sample results S1 to S4. The first sampling circuit 411, directly coupled to the oscillator (not shown), receives the original clock signal $CLK_{ORG}$ that the oscillator generates, and samples the data signal $D_{IN}$ using the original clock signal $CLK_{ORG}$ to generate the first set of sample results S1. The symbol i represents an integer index ranging between 2 and N. Operations of the second sampling circuit 413, the third sampling circuit 415 and the fourth sampling circuit 416 may be concluded as: the $i^{th}$ sampling circuit receives the $(i-1)^{th}$ frequency divided clock signal from the frequency dividing circuit 412, and samples the $(i-1)^{th}$ set of sample results using the $(i-1)^{th}$ frequency divided clock signal to generate an $i^{th}$ set of sample results Si. In this embodiment, the frequency dividing circuit 412 generates three frequency divided clock signals CLK_DIV2, CLK_DIV4 and CLK_DIV8, which have frequencies that are one-half, one-fourth and one-eighth of the original clock signal $CLK_{ORG}$, respectively.

Figure 4B:
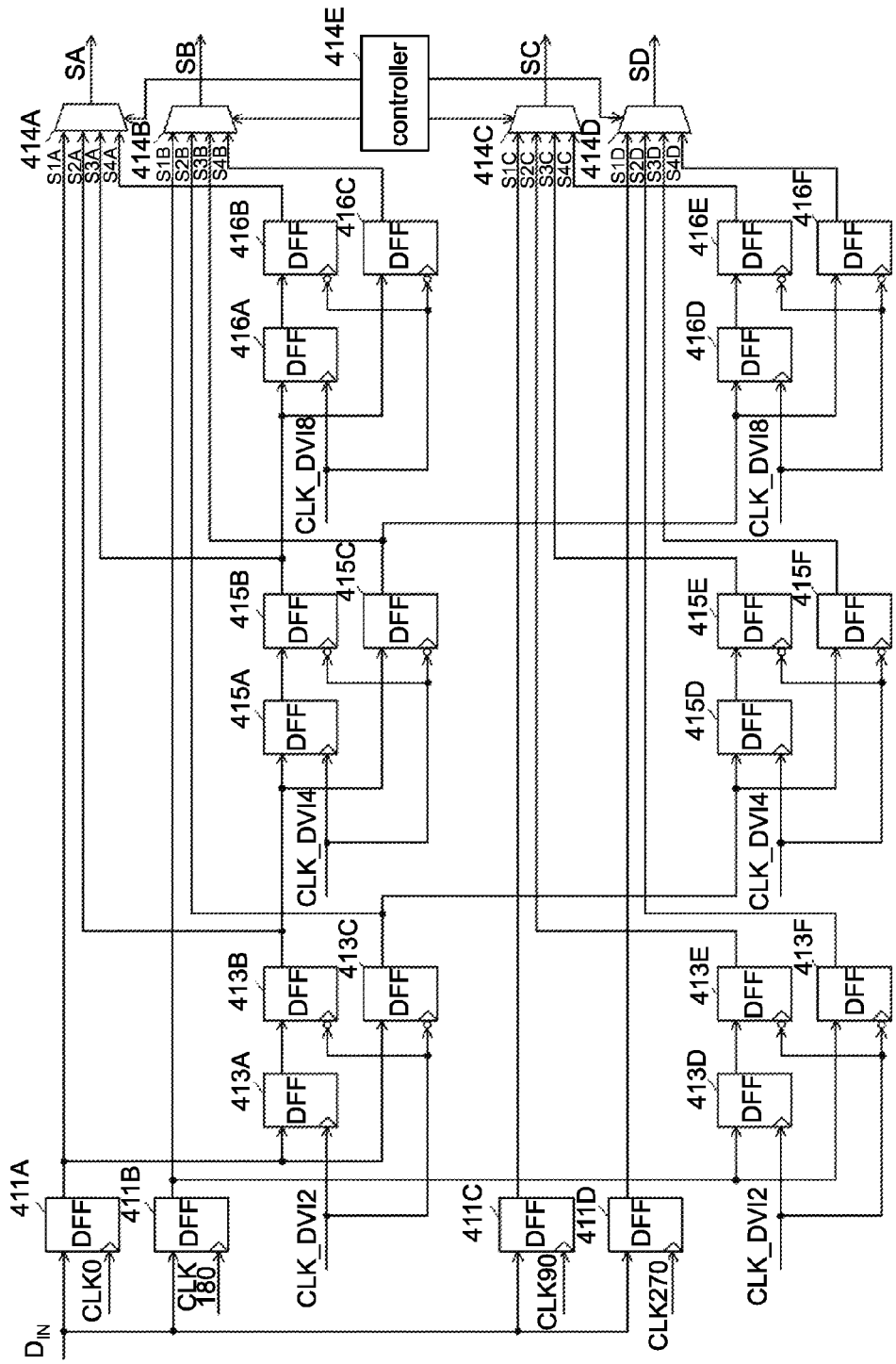
FIG. 4(B) is a detailed circuit diagram of the phase detector.
Figure 4C:
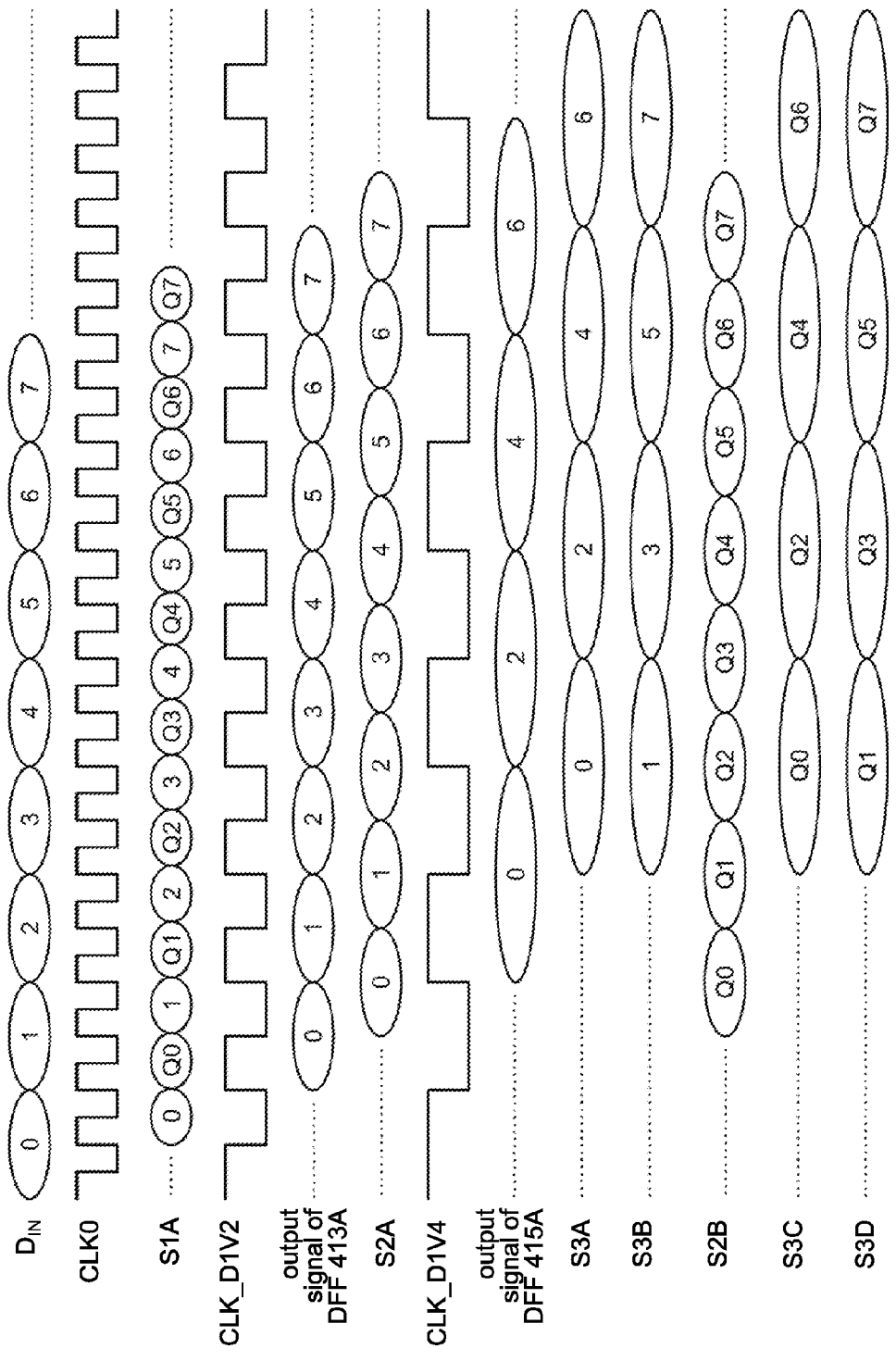
FIG. 4(C) and FIG. 4(D) are timing diagrams of signals of the phase detector corresponding to a twice (2×) oversampling mode and four times (4×) oversampling mode, respectively.
Figure 4D:
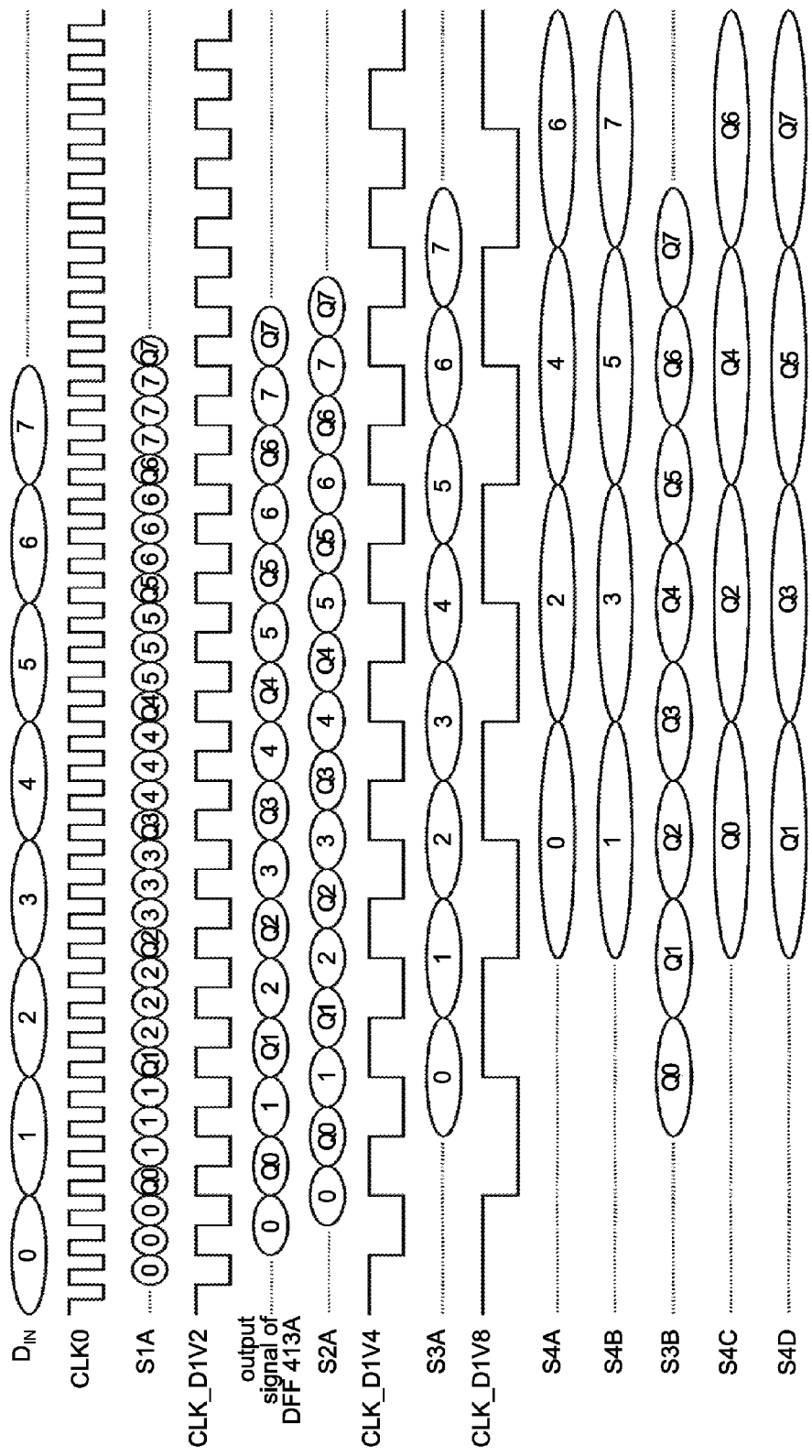

In one embodiment, the phase detector 41 selectively outputs one set of sample results in the N sets of sample results according to the transmission rate of the data signal $D_{IN}$. FIG. 4(B) shows an exemplary partial detailed circuit diagram of the phase detector 41. The phase detector 41 is capable of switching among four modes—a half-rate mode, a full-rate mode, a twice (2×) oversampling mode and a four-times (4×) oversampling mode. In this embodiment, the second sampling circuit 413, the third sampling circuit 415 and the fourth sampling circuit 416 have similar architecture as the second sampling circuit 213 in FIG. 3(A), and each includes six DFFs. When the transmission rate of the data signal $D_{IN}$ is twice the frequency of the original clock signal $CLK_{ORG}$, the phase detector 41 may be set to the half-rate mode. When the transmission rate of the data signal $D_{IN}$ is equal to the frequency of the original clock signal $CLK_{ORG}$, the phase detector 41 may be set to the full-rate mode. When the transmission rate of the data signal $D_{IN}$ is one-half of the frequency of the original clock signal $CLK_{ORG}$, the phase detector 41 may be set to the 2× oversampling mode. When the transmission rate of the data signal $D_{IN}$ is one-fourth of the frequency of the original clock signal $CLK_{ORG}$, the phase detector 41 may be set to the 4× oversampling mode. When the phase detector 41 is in the half-rate mode, the controller 414E sets the multiplexers 414A to 414D to output the sample results S1A to S1D (the first set of sample results S1) of the DFFs 411A to 411D. When the phase detector 41 is in the full-rate mode, the controller 414E sets the multiplexers 414A to 414D to output the sample results S2A to S2D (the second set of sample results S2) of the DFFs 413B, 413C, 413E and 413F in the second sampling circuit 413. When the phase detector 41 is in the 2× oversampling mode, the controller 414E sets the multiplexers 414A to 414D to output the sample results S3A to S3D (the third set of sample results S3) of the DFFs 415B, 415C, 415E and 415F in the third sampling circuit 415. When the phase detector 41 is in the 4× oversampling mode, the controller 414E sets the multiplexers 414A to 414D to output the sample results S4A to S4D (the fourth set of sample results S4) of the DFFs 416B, 416C, 416E and 416F in the fourth sampling circuit 416. FIG. 4(C) and FIG. 4(D) show timing diagrams of signals of the phase detector 41 corresponding to the 2× oversampling mode and the 4× oversampling mode, respectively.

Similarly, when the selecting circuit 414 selects to output the $(i-1)^{th}$ set of sample results, the $i^{th}$ sampling circuit to the $N^{th}$ sampling circuit in the N sampling circuits may be suspended to reduce power consumption. Further, when the phase detector 41 is in the full-rate mode, the 2× oversampling mode or the 4× oversampling mode, the DFFs 411C and 411D in the first sampling circuit 411 have no effect on the output signal of the selecting circuit 414, and can thus be disabled.

It should be noted that, in the above embodiments, although the $i^{th}$ sampling circuit samples the $(i-1)^{th}$ set of sample results, given that the rising/falling edge of the sampling clock is appropriately selected and a delay element is appropriately added, the data signal $D_{IN}$ or another set of sample results generated according to the data signal $D_{IN}$ may also be adopted as the sample target of the $i^{th}$ sampling circuit and substantially the same sample results can be achieved. One advantage of adopting the $(i-1)^{th}$ set of sample results as the sample target of the $i^{th}$ sampling circuit is that, as the phases of the sample targets have been synchronized, the overall quality of the final set of sample results can be enhanced.

In actual applications, the clock data recovery apparatus 200 and the phase detector 41 may be independent units, or may be integrated into an electronic system that requires a clock data recovery function. Further, one person having ordinary skill in the art can understand that, operations and variations in the description associated with the clock data recovery apparatus 200 (e.g., determining which set of sample results is to be outputted according to the transmission rate of the data signal, or which circuit in the phase detector is to be disabled as the circuit has no effect on the final output signal) are applicable to the phase detector 41, and such repeated details are omitted herein.

Figure 5:
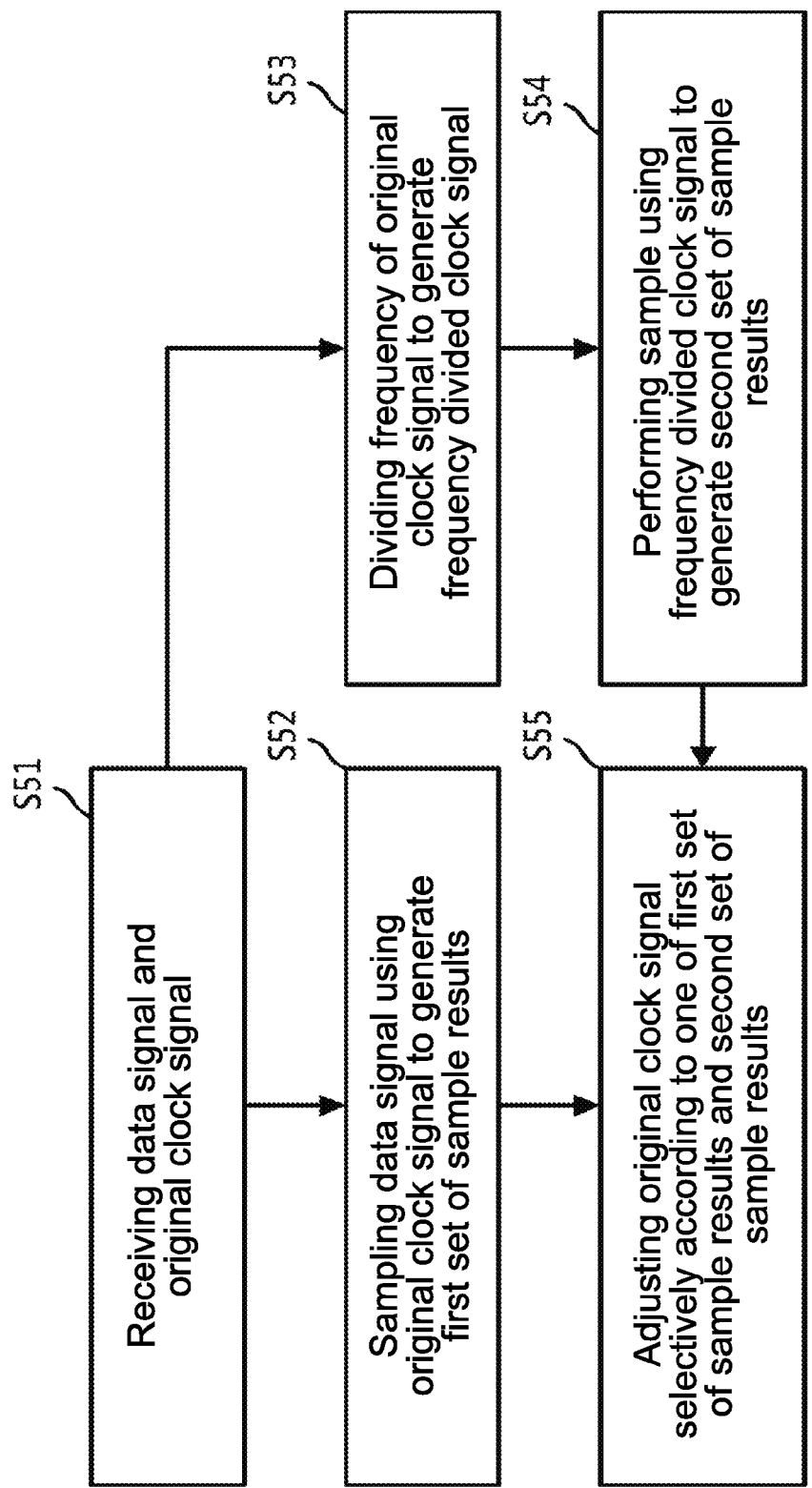
FIG. 5 is a flowchart of a clock data recovery method according to an embodiment of the present invention.

FIG. 5 shows a flowchart of a clock data recovery method is provided according to another embodiment of the present invention. In step S51, a data signal and an original clock signal are received. In step S52, the data signal is sampled using the original clock signal to generate a first set of sample results. In step S53, the frequency of the original clock signal is divided to generate frequency divided clock signal. In step S54, sampling is performed using the frequency divided clock signal to generate a second set of sample results. In step S55, the original clock signal is adjusted selectively according to one of the first set of sample results and the second set of sample results.

In practice, step S52 and step S53 are not limited to being performed in a specific sequence, and may also be performed simultaneously. Further, if the sample target in step S54 is the first set of sample results generated in step S52, step S54 is performed after step S52. operations and variations in the description associated with the clock data recovery apparatus 200 are applicable to the clock data recovery method in FIG. 5, and such repeated details are omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A clock data recovery apparatus, comprising:
an oscillator, generating an original clock signal;
a phase detector, comprising:
   a first sampling circuit, sampling a data signal using the original clock signal to generate a first set of sample results;
   a frequency dividing circuit, receiving the original clock signal and dividing a frequency of the original clock signal to generate a frequency divided clock signal;
   a second sampling circuit, performing sampling using the frequency divided clock signal to generate a second set of sample results; and
   a selecting circuit, selectively outputting one of the first set of sample results and the second set of sample results as a final set of sample results; and
an oscillator control circuit, controlling the oscillator according to the final set of sample results.

2. The clock data recovery apparatus according to claim 1, wherein the second sampling circuit samples a set of sample results, generated according to the data signal, using the frequency divided clock signal to generate the second set of sample results.

3. The clock data recovery apparatus according to claim 1, wherein the second sampling circuit samples the first set of sample results using the frequency divided clock signal to generate the second set of sample results.

4. The clock data recovery apparatus according to claim 1, wherein the second sampling circuit samples the data signal using the frequency divided clock signal to generate the second set of sample results.

5. The clock data recovery apparatus according to claim 1, wherein the selecting circuit determines to output the first set of sample results or the second set of sample results according to a transmission rate of the data signal.

6. The clock data recovery apparatus according to claim 1, wherein the first sampling circuit comprises four sampling sub-circuits that sample the data signal using four state transition points of the original clock signal, respectively, to generate four sample results as the first set of sample results; phase differences between any one of the four state transition points and the other three state transition points are 90°, 180° and 270°, respectively; when a transmission rate of the data signal is twice a frequency of the original clock signal, the selecting circuit outputs the first set of sample results.

7. The clock data recovery apparatus according to claim 1, wherein when the selecting circuit selects to output the first set of sample results, at least one of the frequency dividing circuit and the second sampling circuit is disabled.

8. The clock data recovery apparatus according to claim 1, wherein the second sampling circuit comprises:
a first sampling sub-circuit, performing sampling using a plurality of rising edges of the frequency divided clock signal to generate an intermediate sample result;
a second sampling sub-circuit, sampling the intermediate sample result using a plurality of falling edges of the frequency divided clock signal to generate a first part of the second set of sample results; and
a third sampling sub-circuit, performing sampling using a plurality of falling edges of the frequency divided clock signal to generate a second part of the second set of sample results.

9. A phase detector, comprising:
a frequency dividing circuit, dividing a frequency of an original clock signal to generate (N−1) frequency divided signals having different frequencies, where N is a positive integer greater than 1; and
N sampling circuits, generating N sets of sample results;
a first sampling circuit in the N sampling circuits sampling a data signal using the original clock signal to generate a first set of sample results in the N sets of sample results;
an ith sampling circuit in the N sampling circuits receiving an (i−1)th frequency divided signal from the frequency dividing circuit, and sampling the (i−1)th set of sample results using the (i−1)th frequency divided clock signal to generate an ith set of sample results, where i is an integer index ranging between 2 and N.

10. The phase detector according to claim 9, further comprising:
a selecting circuit, selectively outputting a set of sample results in the N sets of sample results according to a transmission rate of the data signal.

11. The phase detector according to claim 10, wherein the first sampling circuit comprises four sampling sub-circuits that sample the data signal using four state transition points of the original clock signal, respectively, to generate four first sample results as the first set of sample results; phase differences between any one of the four state transition points and the other three state transition points are 90°, 180° and 270°, respectively; when a transmission rate of the data signal is twice a frequency of the original clock signal, the selecting circuit outputs the first set of sample results.

12. The phase detector according to claim 10, wherein when the selecting circuit selects to output the (i−1)th set of sample results, the ith sampling circuit to the Nth sampling circuit in the N sampling circuits are disabled.

13. The phase detector according to claim 9, wherein the ith sampling circuit comprises:
a first sampling sub-circuit, sampling the data signal or the (i−1)th set of sample results using a plurality of rising edges of the (i−1)th frequency divided clock signal to generate an intermediate sample result;
a second sampling sub-circuit, sampling the intermediate sample result using a plurality of falling edges of the (i−1)th frequency divided clock signal to generate a first part of the ith set of sample results; and
a third sampling sub-circuit, sampling the data signal or the (i−1)th set of sample results using a plurality of falling edges of the (i−1)th frequency divided clock signal to generate a second part of the ith set of sample results.

14. A clock data recovery method, comprising:
receiving a data signal and an original clock signal;
sampling the data signal using the original clock signal to generate a first set of sample results;
dividing a frequency of the original clock signal to generate a frequency divided clock signal;
performing sampling using the frequency divided clock signal to generate a second set of sample results; and
adjusting the original clock signal selectively according to one of the first set of sample results and the second set of sample results.

15. The clock data recovery method according to claim 14, wherein the step of performing sampling using the frequency divided clock signal to generate the second set of sample results comprises:
sampling a set of sample results generated according to the data signal using the frequency divided clock signal to generate the second set of sample results.

16. The clock data recovery method according to claim 15, wherein the step of performing sampling using the frequency divided clock signal to generate the second set of sample results comprises:
sampling the first set of sample results using the frequency divided clock signal to generate the second set of sample results.

17. The clock data recovery method according to claim 14, wherein the step of performing sampling using the frequency divided clock signal to generate the second set of sample results comprises:
sampling the data signal using the frequency divided clock signal to generate the second set of sample results.

18. The clock data recovery method according to claim 14, wherein the step of adjusting the original clock signal selectively according to one of the first set of sample results and the second set of sample results comprises:
adjusting the original clock signal selectively according to one of the first set of sample results and the second set of sample result according to a transmission rate of the data signal.

19. The clock data recovery method according to claim 14, wherein the step of sampling the data signal using the original clock signal to generate the first set of sample results comprises:

sampling the data signal using four state transition points of the original clock signal, respectively, to generate four first sample results as the first set of sample results; wherein phase differences between any one of the four state transition points and the other three state transition points are 90°, 180° and 270°, respectively; and the step of adjusting the original clock signal selectively according to one of the first set of sample results and the second set of sample result comprises:

adjusting the original clock signal according to the first set of sample results when a transmission data rate of the data signal is twice a frequency of the original clock signal.

20. The clock data recovery method according to claim 14, wherein the step of performing sampling using the frequency divided clock signal to generate the second set of sample results comprises:

performing sampling using a plurality of rising edges of the frequency divided clock signal to generate an intermediate sample result;

sampling the intermediate sample result using a plurality of falling edges of the frequency divided clock signal to generate a first part of the second set of sample results; and performing sampling using a plurality of falling edges of the frequency divided clock signal to generate a second part of the second set of sample results.

\* \* \* \* \*